United States Patent [19]
Regier

[11] Patent Number: 5,646,620
[45] Date of Patent: Jul. 8, 1997

[54] METHOD AND APPARATUS FOR DEGLITCHING DAC SIGNALS

[75] Inventor: Christopher G. Regier, Cedar Park, Tex.

[73] Assignee: National Instruments Corporation, Austin, Tex.

[21] Appl. No.: 460,074

[22] Filed: Jun. 2, 1995

[51] Int. Cl.$^6$ .................................................. H03M 1/06
[52] U.S. Cl. ........................................ 341/118; 341/144
[58] Field of Search ..................................... 341/118, 144

[56] References Cited

U.S. PATENT DOCUMENTS

| | | | |
|---|---|---|---|
| 3,412,335 | 11/1968 | Risely . | |
| 4,285,051 | 8/1981 | Henneuse | 365/45 |
| 4,584,559 | 4/1986 | Penney | 340/347 SH |
| 5,034,744 | 7/1991 | Obinata | 341/118 |
| 5,039,872 | 8/1991 | Oldham | 307/261 |
| 5,532,629 | 7/1996 | Nagaraj | 327/94 |

OTHER PUBLICATIONS

*1993 Applications Reference Manual*, Analog Devices, Inc., 1993, pp. 8–208.
*Siliconix Low–Power Discretes Databook 1994*, ION Associates, Inc. (Jun. 22, 1994), pp. 12–42.

*Primary Examiner*—Jeffrey A. Gaffin
*Assistant Examiner*—Jason L. W. Kost
*Attorney, Agent, or Firm*—Jeffrey C. Hood; Conley, Rose & Tayon, P.C.

[57] ABSTRACT

A DAC deglitch circuit comprising a switch circuit for grounding the DAC output during the DAC's transitional period. The DAC is preferably a current type, although a voltage type is also contemplated. The switch circuit preferably includes a biased transistor circuit receiving the update or hold signal for grounding the output of the DAC during the hold period. The deglitch circuit generally causes a consistent glitch at every transition, which is easily filtered out by a filter circuit. The deglitch circuit is very simple inexpensive and consumes very little space and power.

17 Claims, 5 Drawing Sheets

METHOD AND APPARATUS FOR DEGLITCHING DAC SIGNALS

FIELD OF THE INVENTION

The present invention relates to digital-to-analog converters, and more particularly to a deglitch circuit for removing the noise or glitches when switching from one digital code to another.

DESCRIPTION OF THE RELATED ART

Almost all digital-to-analog converters (DACs) generate undesirable noise or glitches when switching from one digital code to another. The size of the glitch typically depends upon which digital codes are involved in a transition. For example, one particularly problematic transition is the major carry from a −1 digital value to a 0 digital value and also when transitioning from 0 to −1 since all of the bits must change state. Most DACs generate a relatively large glitch or spike when performing the transition from −1 to 0 and vice-versa. The noise from the extraneous glitches causes distortion which depreciates the signal quality and signal to noise ratio (SNR). Such distortion can result in invalid or incorrect data.

Most DACs assert a current signal which is converted to a voltage using an amplifier circuit. In practice, many deglitch circuits are known for removing the typical glitches at the output of the DAC current to voltage converting amplifier, which will be referred to as the DAC amplifier. Although some deglitch circuits create new glitches being the same size or even larger than the original glitches, such deglitchers may be useful as long as the new glitches are more code-independent. Code independent glitches are more easily filtered than code dependent glitches. Thus, if the new glitches are relatively code-independent, then the noise energy has been moved from the signal frequency, where the glitches are very difficult if not impossible to filter out, to the sampling frequency, where the glitches are relatively easy to filter out. In fact, all known deglitch circuits produce various degrees of glitches at the sampling frequency. An anti-imaging, lowpass filter having a cut off frequency at about half the sample rate is usually used to filter out the glitches at the sampling frequency.

Most known deglitch circuits are implemented with a track and hold (T/H) circuit. The circuit tracks the DAC amplifier output until just before an update, at which time it goes into a hold mode while the DAC is transitioning from one digital code to another. The deglitch circuit stays in hold mode until the DAC transition is completed, at which time the deglitch circuit returns to the tracking mode. This effectively eliminates much of the glitch noise associated with DACs.

There are several problems with typical prior art DAC circuits. For example, a known T/H integrated circuit (IC) can be used to deglitch the output of a DAC, but it is rather expensive. The IC is relatively large in size and consumes valuable space on the printed circuit board (PCB). Also, most T/H circuits require a hold capacitor. Even discrete deglitch circuits typically include expensive and relatively large metal-oxide semiconductor field-effect transistors (MOSFETs), operational amplifiers (opamps), precision resistors and a hold capacitor. Thus, known deglitchers are expensive and large. Also, known deglitch circuits tend to impact the DAC offset, gain and DC linearity errors, which must be corrected or otherwise filtered. Furthermore, because known deglitch circuits almost invariably include an operational amplifier, they consume valuable power.

It is desired to provide a relatively inexpensive DAC deglitch circuit that performs comparably with known deglitchers yet is smaller, less power hungry and which does not otherwise impact the performance of the DAC itself.

SUMMARY OF THE INVENTION

A DAC deglitch circuit according to the present invention includes a switch circuit for grounding the DAC output during the DAC's transitional period. The switch circuit preferably comprises a biased transistor circuit, which grounds the output of the DAC during the update or hold. Thus, the hold function is preferably accomplished by the finite bandwidth of the DAC amplifier at the output of the DAC. In this manner, the standard hold capacitor is unnecessary and therefore eliminated.

The operation of the switch circuit grounding the DAC output causes a rather large droop rate. However, the actual droop is negligible since the update or hold time is very short. During the track mode, the switch circuit is turned off and thus does not consume any power. Therefore, a deglitch circuit according to the present invention consumes very little space, has no effect on the DAC offset, gain or linearity errors, is very inexpensive and consumes very little power compared to prior art implementations.

A transistor deglitch circuit according to the present invention removes the traditional code dependent glitches but inserts relatively uniform glitches at every transition of the DAC. However, the new glitches are uniform and substantially code independent. Thus, the distortion energy at the DAC amplifier output is transferred to the sampling frequency, so that the ultimate distortion is dramatically reduced. In fact, since the new glitches occur at every transition, they are easily filtered out using the anti-imaging, lowpass filter circuit at the output of the current to voltage converting amplifier to reject images.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
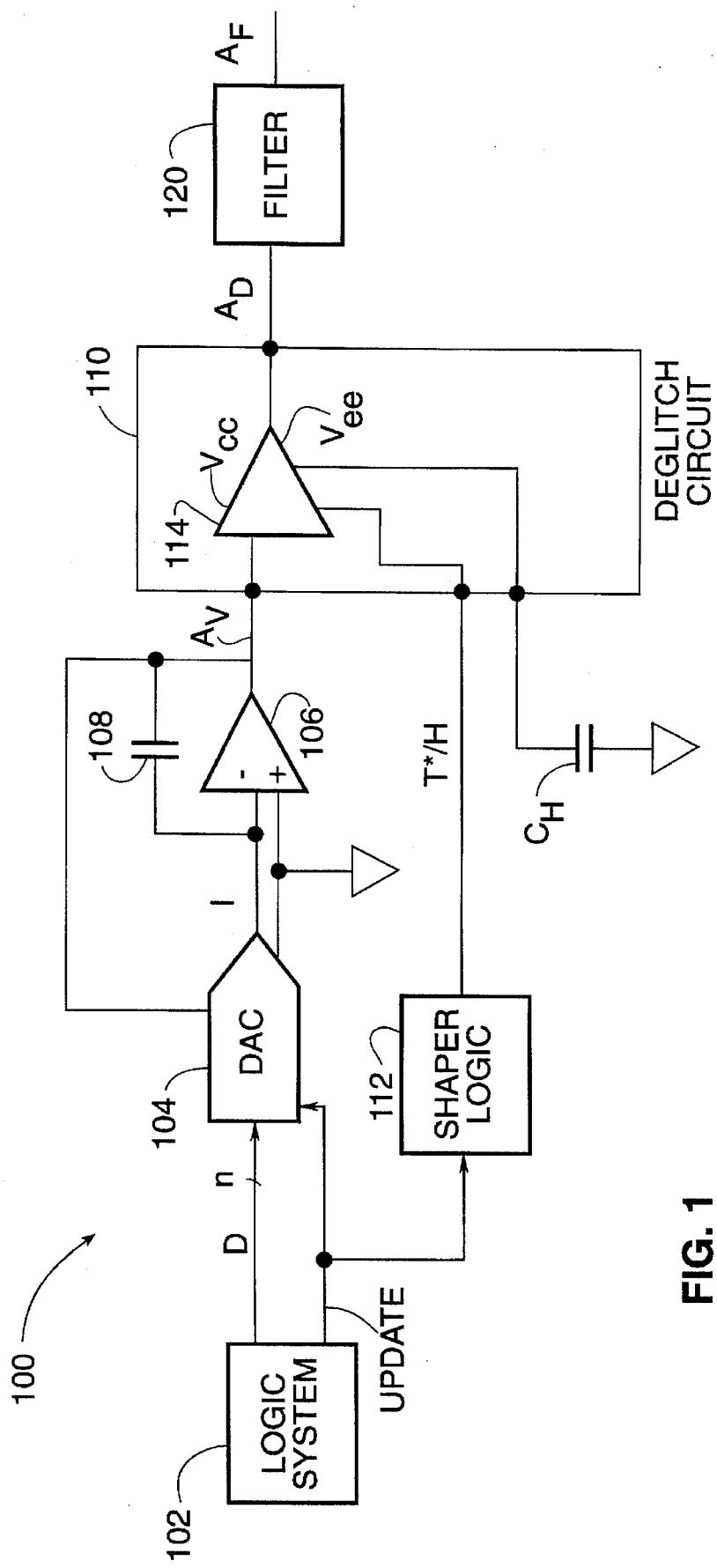
FIG. 1 is a schematic diagram of a DAC and deglitch system using a deglitch circuit according to prior art.

Referring now to FIG. 1, a digital-to-analog converter (DAC) system 100 is shown including a deglitch circuit 110 according to prior art. A logic system 102 asserts a digital signal or digital code, referred to as D, to the input of a DAC 104, which typically is a current output type DAC, although other type DACs are contemplated. The DAC 104 asserts a current output signal I to the inverting input of a DAC amplifier 106, having its non-inverting input coupled to ground. The DAC 104 typically includes an internal feedback resistor (not shown) and has a feedback input connected to the output of the DAC amplifier 106 for defining the range of the output analog signal $A_V$. A capacitor 108 is coupled between the inverting input and the output of the DAC amplifier 106, which asserts the analog signal $A_V$. The $A_V$ signal is an analog version of the digital code D applied to the input of the DAC 104. The DAC amplifier 106 and the internal resistor of the DAC 104 generally serve as a current to voltage converter for converting the current output of the DAC 104 to the $A_V$ voltage signal. The capacitor 108 is provided for stability.

Figure 2A:
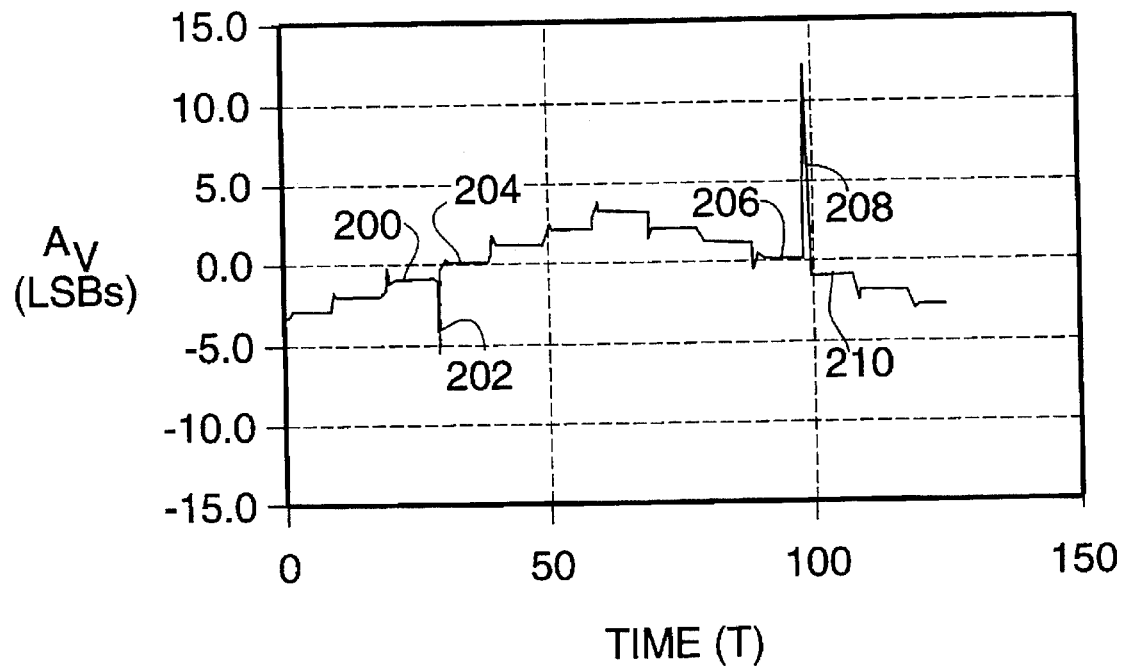
FIG. 2A is a time domain plot of the output of the DAC amplifier of FIG. 1 versus time illustrating undesirable glitches.

It is noted that the $A_V$ signal at the output of the DAC amplifier 106 typically includes undesirable noise and/or glitches. FIG. 2A is a time domain plot of the least significant bit (LSB) of the $A_V$ signal versus time in response to a stairstep input waveform from the logic system 102. As FIG. 2A illustrates, the $A_V$ signal includes glitches at each transition of the DAC 104 in the form of spikes caused by overshoots during transitions from one discrete voltage level to the next. There are certain transitions that are more problematic and include significantly greater glitches than others. In particular, the DAC 104 and the DAC amplifier 106 cause a large negative glitch 202 to occur when converting from −1 at 200 to 0 at 204. The glitch 202 occurs because the digital bits must all change state when a digital code of −1 is converted to a digital code of 0. A similar problem occurs when converting from a 0 value at 206 to a −1 value at 210, where a very large positive glitch 208 occurs. FIG. 2A also illustrates that the glitches are relatively dependent on the particular digital code D, so that the glitches are more prominent at certain codes.

Figure 2B:
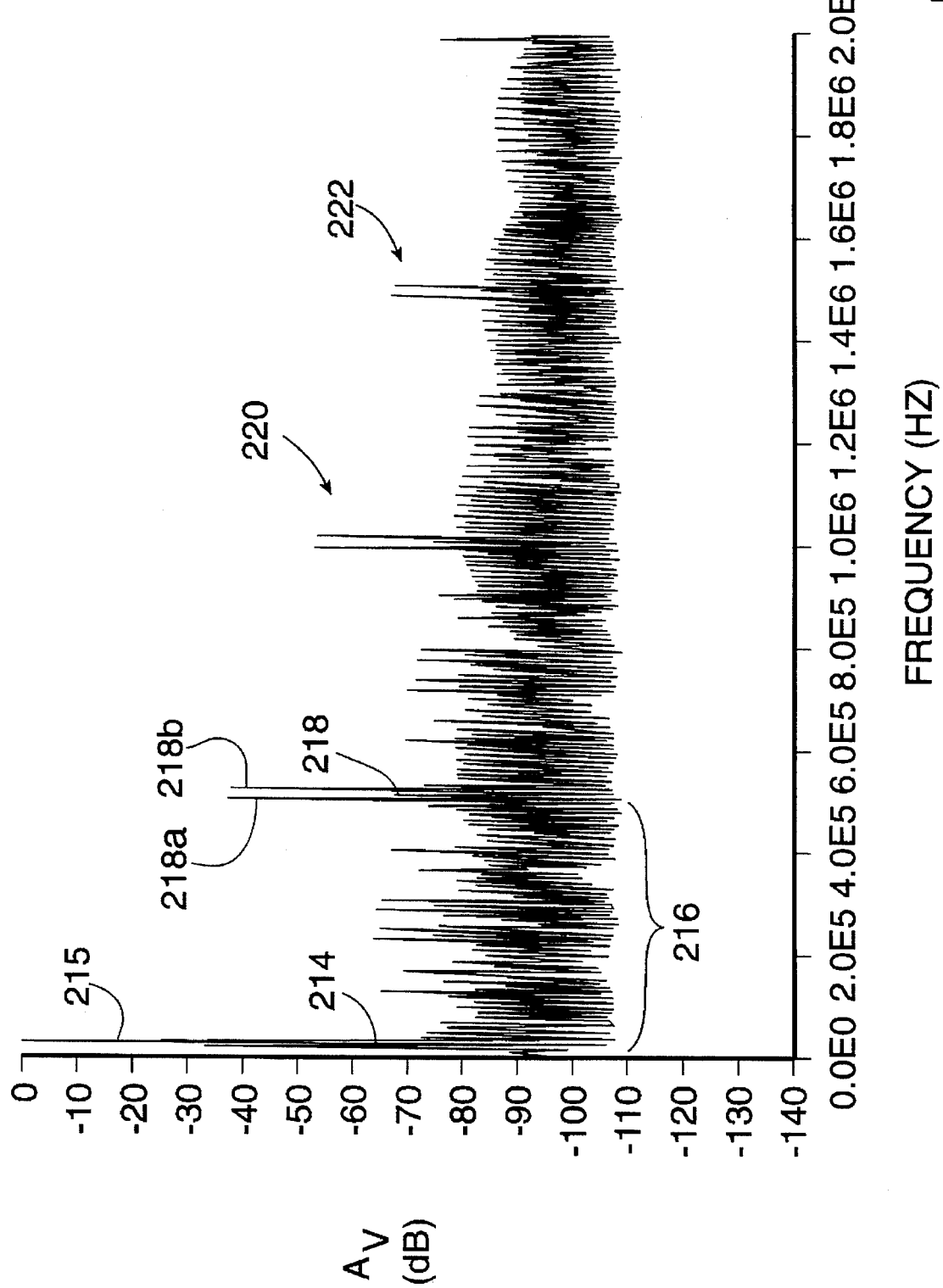
FIG. 2B is a plot of the frequency spectrum at the output of the DAC amplifier of FIG. 1.

FIG. 2B is a plot of the frequency spectrum of the $A_V$ signal in decibels (dB) versus frequency in Hertz (Hz) in response to a sinusoidal data pattern provided by the logic system 102. Several characteristics of the plot shown in FIG. 2B are noteworthy. First, a spike shown at 214 of between −60 and −70 dB represents DC energy. A large spike 215 of about −65 dB is the fundamental signal frequency, which is about 10 kHz for this example. Another spike 218 is at the sampling rate of approximately 500 kHz, including two image spikes 218a, 218b at the sampling rate +/− the signal frequency. The spike 218 represents the sampling rate energy. Other sets of spikes shown at 220, 222 are shown at sampling rate harmonics. There is a significant amount of distortion and noise as shown in the frequency range between 0–500 kHz as shown at 216, where the noise energy throughout the frequency range 216 reaches as high as approximately −65 dB for many frequencies. It is desired to filter out much of this distortion and noise to improve the DAC characteristics.

FIG. 1 further includes a deglitch circuit 110 according to prior art. Typically, the deglitch circuit 110 is provided on a separate integrated circuit (IC) or chip and includes an input for receiving the $A_V$ signal as well as an input for receiving a hold signal, referred to as T*/H. The logic system 102 asserts an UPDATE signal while it changes the digital code D provided to the DAC 104, where the UPDATE signal is also provided to the DAC 104. Optional shaper logic 112 generally converts the UPDATE signal to the T*/H signal, which is preferably a well-defined pulse for identifying the track versus the hold modes of the deglitch circuit 110. The asterisk (*) indicates that the T*/H is asserted low during the track periods (T) and asserted high during the update or hold periods (H) while the digital code D is changing. It is noted that in some embodiments the UPDATE signal may be used directly so that the shaper logic 112 would not be necessary.

The T*/H signal is provided to the deglitch circuit 110, which generally includes a plurality of components including an amplifier device 114 receiving the T*/H signal. Furthermore, a separate hold capacitor $C_H$ is connected to the amplifier 114, which receives the $A_V$ signal at its input and asserts a deglitched signal referred to as $A_D$. The $A_D$ signal is then provided to the input of an anti-aliasing, lowpass filter 120, which provides a filtered output signal referred to as $A_F$. The filter 120 preferably has a cutoff frequency of half the sampling frequency, where the cutoff frequency is approximately 250 kHz in the example shown.

When the UPDATE signal is deasserted, the T*/H signal is deasserted indicating tracking mode and the amplifier 114 generally asserts the $A_D$ signal to follow the $A_V$ signal. The voltage of the $A_V$ signal is applied across the hold capacitor $C_H$ during the tracking period, where the capacitor $C_H$ charges to a discrete voltage level corresponding to the digital code D. The logic system asserts the UPDATE signal to indicate that the digital code D is going to change, and the shaper logic 112 respondingly asserts the T*/H signal high indicating hold mode. The amplifier 114 holds the $A_D$ signal steady corresponding to the voltage stored on the capacitor $C_H$ during the update or transitional period while the $A_V$ signal glitches. The amplifier 114 attempts to assert a new steady discrete voltage after the $A_V$ signal stabilizes. In this manner, the glitches on the $A_V$ signal are generally converted to more code independent glitches on the $A_D$ signal. The filter 120 removes most of these code independent glitches for providing a relatively clean $A_F$ signal.

Although the deglitch circuit 110 shown in FIG. 1 is effective in removing glitches from the $A_V$ signal, there are several problems with its use. The deglitch circuit 110 is typically found on a separate chip, which is relatively large in size and thus consumes valuable space on a printed circuit board (PCB). The deglitch circuit 110 often requires a hold capacitor $C_H$ which often must be separately mounted and connected, although the hold capacitor $C_H$ is sometimes provided within the IC 110. Alternatively, the deglitch circuit 110 may comprise a collection of relatively expensive and large MOSFETs, operational amplifiers and precision resistors with a hold capacitor $C_H$. In either embodiment, the deglitch circuit 110 continually consumes a substantial amount of power from the power supply and has an impact on the offset, gain and DC linearity errors of the DAC 104.

Figure 3:
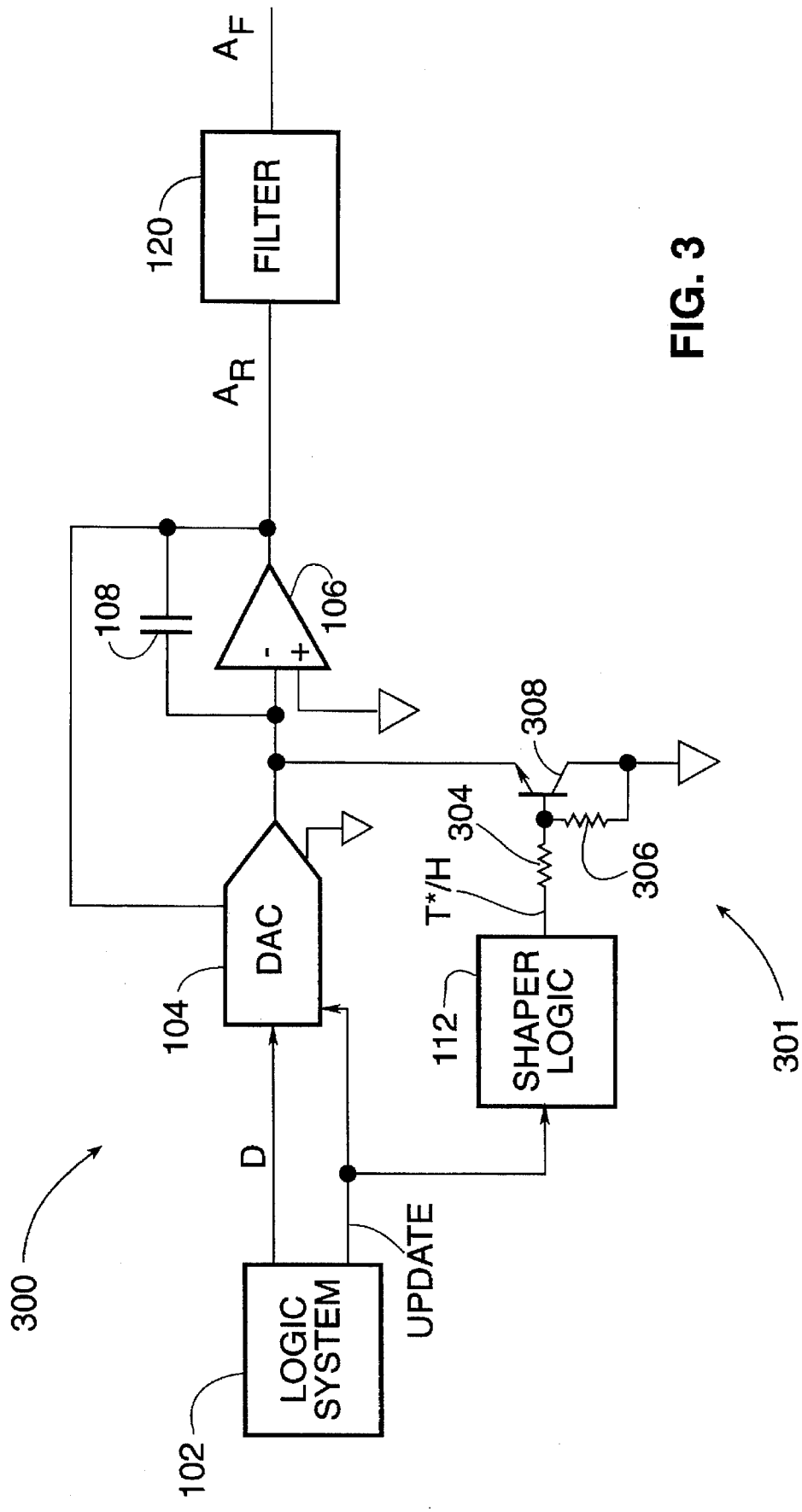
FIG. 3 is a DAC system including a deglitch circuit according to the present invention.

Referring now to FIG. 3, a schematic diagram is shown of a DAC system 300 including a deglitch circuit 301 implemented according to the present invention. Similar components as that shown in FIG. 1 assume identical reference numerals. In particular, the logic system 102, the DAC 104, the DAC amplifier 106, the capacitor 108, as well as the shaper logic 112 are included and connected in similar fashion. Again, the shaper logic 112 is optional if the UPDATE signal can be used directly. In the DAC system 300, however, the T*/H signal at the output of the optional shaper logic 112 is provided to one end of a resistor 304, having its other end connected to one end of a resistor 306 and to the base of an npn bipolar transistor 308. The other end of the resistor 306 and the collector of the transistor 308 are connected to ground. The emitter of the transistor 308 is connected to the output of the DAC 104. The DAC amplifier 106 asserts a "reglitched" signal $A_R$ directly to the filter 120, which asserts the filtered output signal $A_F$. Thus, the hold capacitor 108 and the deglitch circuit 110 at the output of the DAC amplifier 106 in FIG. 1 are replaced by the deglitch circuit 301 coupled at the output of the DAC 104 in FIG. 3.

In operation, the transistor 308 is activated when the T*/H signal is asserted high during an update of the DAC 104, which shunts the output current I of the DAC 104 to ground. This causes a significantly large droop rate at the output of the DAC amplifier 106. However, the actual decay of the output voltage of the DAC amplifier 106 due to such drooping is negligible and inconsequential since the hold time is very short, such as 100–200 nanoseconds (ns). The transistor 308 is turned completely off when the T*/H signal is negated. Thus, the transistor 308 does not consume any power in the tracking mode. The transistor 308 is preferably operated in inverted mode to minimize offset, which could otherwise translate to droop, and to also minimize charge injection, which could otherwise translate to increased glitching. The transistor 308 is preferably the MMBTH10 or the MPSH10 by Motorola, although similar transistors are contemplated, such as a pnp bipolar transistor. Of course, entirely different type transistor circuits are contemplated, such as a FET or the like, for performing the grounding function during the update or hold period.

It is noted that the deglitch circuit 301 shown in FIG. 3 mainly comprises the transistor 308 and a biasing circuit including the resistors 304 and 306. The values of the resistors 304, 306 are not critical and may be any suitable values for appropriately biasing the transistor 308 on during the hold period and off during the tracking period. Therefore, the resistors 304, 306 may be any standard off-the-shelf components and need not be costly precision resistors. Thus, the deglitch circuit 301 is relatively simple and consumes very little space on a PCB. Furthermore, the deglitch circuit 301 is very cost effective and has no impact on the offset, gain and DC linearity errors of the DAC 104. During the track mode, the transistor 308 is completely off and thus the deglitch circuit 301 consumes no power. Since the hold time is so short, the transistor 308 and resistors 304 and 306 consume very little power during the hold mode.

Figure 4A:
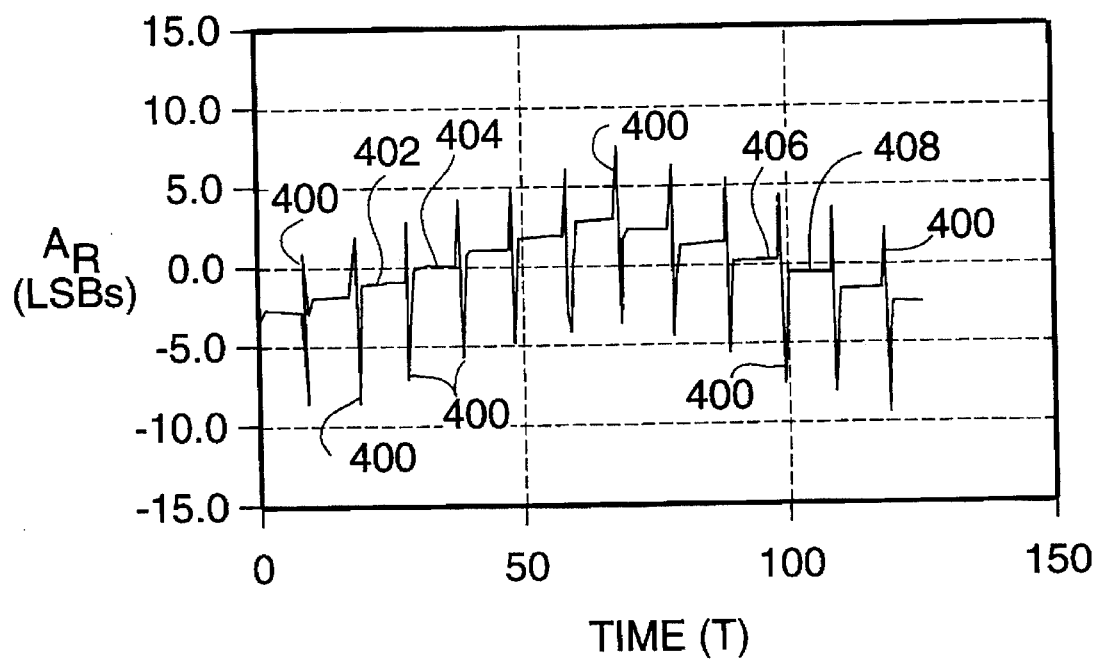
FIG. 4A is a plot of the output of the DAC amplifier of FIG. 3 versus time illustrating modified and uniform glitches.

FIG. 4A is a time domain plot of the LSB of the $A_R$ signal versus time in response to the same stairstep waveform provided by the logic system 102 as that shown in FIG. 2A. FIG. 4A illustrates that during every transition, the output of the DAC amplifier 106 asserts a relatively consistent glitch 400. The glitches 400 are primarily uniform even for the transitions from a −1 value at 402 to the 0 value at 404, and vice-versa from the 0 value at 406 to the −1 value at 408.

Figure 4B:
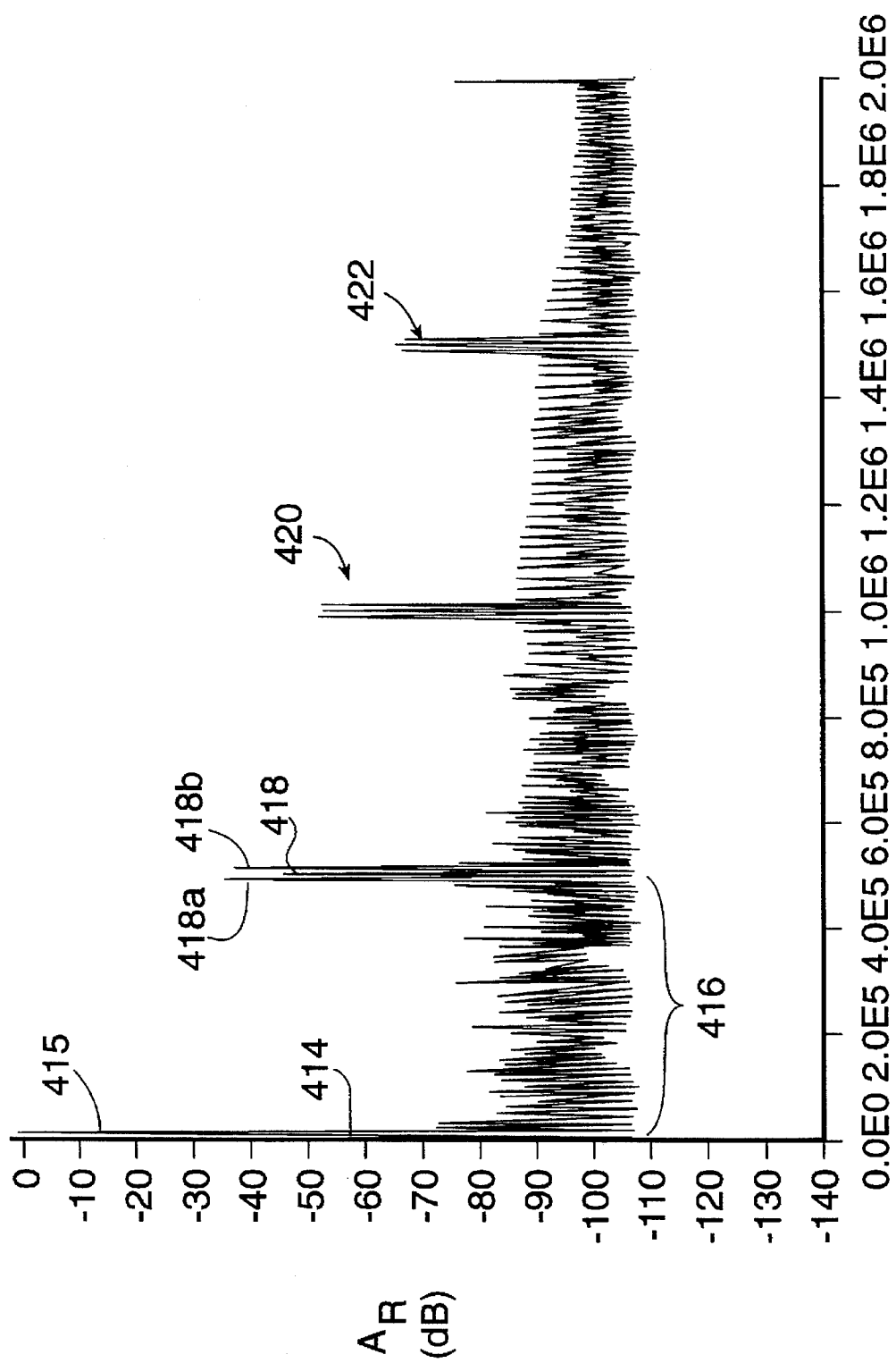
FIG. 4B is a plot of the frequency spectrum at the output of the DAC amplifier of FIG. 3.

Although it might appear from FIG. 4A that the glitching problem has been increased, FIG. 4B illustrates the benefits of the present invention, which is a plot of the frequency spectrum of the $A_R$ signal in dB versus frequency in Hz in response to a sinusoidal data pattern provided by the logic system 102. The spikes 414, 415, 418, 418a, 418b, 420 and 422 correspond to the spikes 214, 215, 218, 218a, 218b, 220 and 222 of FIG. 2B. The sampling rate energy represented by the spike 418 is actually increased from approximately −65 dB in FIG. 2A to about −45 dB in FIG. 4A. Also, the distortion in the frequency range 0–500 kHz at 416 is actually decreased to about −75 dB or less. The noise energy has been shifted from the signal frequency (10 kHz) to the sampling frequency (500 kHz), where the new glitches 400 are easy to filter out. The filter 120 almost completely eliminates all of the glitches 400 at every transition. The results are comparable to and often superior to the deglitch circuit 110 of prior art.

In particular experiments, the glitches experienced in a DAC circuit without a deglitch circuit varied between 0 to +/−100 millivolts (mV) peak, whereas DAC circuits using a deglitch circuit according to the present invention experienced much more consistent glitches around +/−30 mV peak. The harmonic distortion of the $A_R$ signal with the deglitch circuit 301 is about 10 dB lower in FIG. 4B as compared to FIG. 2B. The filter 120 filters even the lower noise energy more effectively to reduce the glitches 400.

It is now appreciated that a deglitch circuit according to the present invention transfers distortion energy caused by a DAC from the signal frequency to the sampling frequency, thereby resulting in more code-independent energy. Such transferred energy is easily filtered thereby resulting in smooth and filtered DAC transitions. A deglitch circuit according to the present invention is relatively simple and inexpensive and consumes very little space and power on the PCB. Although the present invention is illustrated herein for a current type DAC, a voltage-type DAC is contemplated where the output of the DAC is converted to current at virtual ground for desired operation.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A deglitcher for reducing glitches caused by a digital to analog converter (DAC) system including a DAC providing an analog output to an amplifier, the DAC system further asserting a hold signal during transitions of the DAC analog output, comprising:

a bias circuit for receiving said hold signal; and a single transistor coupled to said bias circuit for grounding the analog output of the DAC when the hold signal is asserted;

wherein the deglitcher includes only one transistor for reducing glitches caused by the digital to analog converter.

2. The deglitcher of claim 1, wherein said bias circuit is a voltage divider.

3. The deglitcher of claim 1, wherein said voltage divider comprises two series resistors.

4. The deglitcher of claim 1, wherein said transistor is a bipolar transistor.

5. The deglitcher of claim 4, wherein said bipolar transistor is coupled to said bias circuit to operate in inverted mode.

6. The deglitcher of claim 1, wherein the DAC is a current output DAC and the amplifier is a current to voltage converter.

7. The deglitcher of claim 1, wherein the deglitcher is not coupled in series in the signal path between the DAC and the amplifier.

8. The deglitcher of claim 1, wherein said grounding of said input of said amplifier transfers distortion energy during said transition of said DAC analog output to a sampling frequency of said DAC.

9. A digital to analog converter system comprising:

a digital to analog converter asserting an analog signal;

an amplifier coupled to said digital to analog converter and receiving said analog signal for providing a reglitched output signal;

a logic system for asserting digital codes and an update signal to said digital to analog converter, wherein said update signal is asserted during transitions of said digital codes; and a switch circuit coupled to said digital to analog converter for grounding said analog signal during transitional periods of said digital to analog converter, wherein said switch circuit operates to reduce glitches caused by the digital to analog converter, wherein said switch circuit comprises:

a bias circuit receiving said update signal; and a single transistor coupled to said bias circuit for grounding the output of said digital to analog converter while said update signal is asserted;

wherein said switch circuit includes only one transistor.

10. The digital to analog converter system of claim 9, wherein said transistor is a bipolar transistor.

11. The digital to analog converter system of claim 10, wherein said transistor is coupled to operate in inverted mode.

12. The digital to analog converter system of claim 9, wherein:

said digital to analog converter is a current-type converter asserting a current signal; and said amplifier is a current to voltage converting amplifier for asserting an output voltage signal.

13. The digital to analog converter system of claim 7, further comprising:

shaper logic receiving said update signal for providing a track and hold signal; and wherein said switch circuit receives said track and hold signal and grounds said analog signal when a hold period is indicated.

14. The digital to analog converter system of claim 7, wherein said bias circuit comprises a resistive voltage divider.

15. The digital to analog converter system of claim 9, further comprising:

a lowpass filter coupled to said amplifier for filtering said reglitched output signal.

16. The digital to analog converter system of claim 9, wherein the switch circuit is not coupled in series in the signal path between the DAC and the amplifier.

17. The digital to analog converter system of claim 9, wherein said grounding of said input of said amplifier transfers distortion energy during said transition of said DAC analog output to a sampling frequency of said DAC.

* * * * *

UNITED STATES PATENT AND TRADEMARK OFFICE
CERTIFICATE OF CORRECTION

PATENT NO.  : 5,646,620
DATED       : July 8, 1997
INVENTOR(S) : Christopher G. Regier It is certified that error appears in the above-indentified patent and that said Letters Patent is hereby corrected as shown below:

Claim 13, col. 7, line 21, please delete "claim 7" and substitute "claim 9".

Claim 14, col. 8, line 6, please delete "claim 7" and substitute "claim 9".

Signed and Sealed this

Twenty-third Day of September, 1997

*Attest:*

BRUCE LEHMAN

*Attesting Officer*  *Commissioner of Patents and Trademarks*